United States Patent
Mevel et al.

(10) Patent No.: US 8,145,167 B2
(45) Date of Patent: Mar. 27, 2012

(54) AUTOMATIC GAIN CONTROL OF RADIO DEVICES

(75) Inventors: Thierry Mevel, Gonneville en Auge (FR); Yves J. G. Richard, Saint Sulpice la Foret (FR)

(73) Assignee: NXP B.V., Eindhoven (NL)

( * ) Notice: Subject to any disclaimer, the term of this patent is extended or adjusted under 35 U.S.C. 154(b) by 545 days.

(21) Appl. No.: 12/376,027

(22) PCT Filed: Aug. 1, 2007

(86) PCT No.: PCT/IB2007/053035
§ 371 (c)(1),
(2), (4) Date: Feb. 2, 2009

(87) PCT Pub. No.: WO2008/015648
PCT Pub. Date: Feb. 7, 2008

(65) Prior Publication Data
US 2010/0009646 A1    Jan. 14, 2010

(30) Foreign Application Priority Data

Aug. 3, 2006  (EP) .................................. 06118410
Oct. 27, 2006  (EP) .................................. 06123117

(51) Int. Cl.
*H04B 1/06* (2006.01)
*H04B 7/00* (2006.01)

(52) U.S. Cl. .................................................. 455/234.1

(58) Field of Classification Search ................ 455/234.1
See application file for complete search history.

(56) References Cited

U.S. PATENT DOCUMENTS

| 2003/0143967 A1 | 7/2003 | Ciccarelli et al. |
| 2003/0181178 A1* | 9/2003 | Zerod et al. .............. 455/232.1 |
| 2004/0063413 A1 | 4/2004 | Schaffer et al. |
| 2004/0242174 A1 | 12/2004 | Kim et al. |

FOREIGN PATENT DOCUMENTS

| EP | 1679792 A | 7/2006 |
| GB | 2371690 A | 7/2002 |
| WO | 0070774 A | 11/2000 |

* cited by examiner

*Primary Examiner* — Lincoln Donovan
*Assistant Examiner* — Daniel Rojas

(57) ABSTRACT

A method of operating a RF device having a first RF gain stage (34) comprising a programmable attenuator (36) coupled to a RF amplifier (38) and a second narrowband gain controlled amplifying stage (24) for amplifying a signal in a wanted bandwidth, comprises selecting a gain setting of the first RF gain stage to maximize the signal-to-noise (SNR) by minimizing the total noise in a wanted signal and a gain setting of the second narrowband amplifying stage to provide a substantially constant level output. In order to select the gain setting of the first RF gain stage, the RF device includes a control stage (40) which takes into account the gain settings of the first RF stage and the second gain controlled amplifying stage, the distortion noise (referred to the RF input) and the thermal noise (referred to the RF input) when selecting a gain setting to be applied to the programmable attenuator to minimize the total noise.

14 Claims, 7 Drawing Sheets

BACKGROUND

| | | Ndist | |
|---|---|---|---|
| RF_Gain in dB | Ptot (dBm) | Frequency Range in MHz | |
| | | 470 to 666 | 666 to 862 |
| 10 | <-35 | 1.0 | 1.2 |
| | -35 to -25 | 4.0 | 4.8 |
| | -25 to -15 | 7.0 | 8.4 |
| | -15 to -5 | 8.0 | 9.6 |
| | >-5 | 16.0 | 19.2 |
| 12 | <-35 | 1.1 | 1.3 |
| | -35 to -25 | 4.4 | 5.3 |
| | -25 to -15 | 7.7 | 9.2 |
| | -15 to -5 | 8.8 | 10.6 |
| | >-5 | 17.6 | 21.1 |
| 14 | <-35 | 1.2 | 1.5 |
| | -35 to -25 | 4.8 | 5.8 |
| | -25 to -15 | 8.5 | 10.2 |
| | -15 to -5 | 9.7 | 11.6 |
| | >-5 | 19.4 | 23.2 |
| 16 | <-35 | 1.3 | 1.6 |
| | -35 to -25 | 5.3 | 6.4 |
| | -25 to -15 | 9.3 | 11.2 |
| | -15 to -5 | 10.6 | 12.8 |
| | >-5 | 21.3 | 25.6 |
| 18 | <-35 | 1.5 | 1.8 |
| | -35 to -25 | 5.9 | 7.0 |
| | -25 to -15 | 10.2 | 12.3 |
| | -15 to -5 | 11.7 | 14.1 |
| | >-5 | 23.4 | 28.1 |

FIG. 8

| RF_Gain in dB | BB_Gain (dBm) | Ntherm Frequency Range in MHz | |
|---|---|---|---|
| | | 470 to 666 | 666 to 862 |
| 10 | <0 | 25.0 | 30.0 |
| | 0 to 10 | 22.0 | 26.4 |
| | 10 to 20 | 20.0 | 24.0 |
| | 20 to 30 | 15.0 | 18.0 |
| | 30 to 40 | 10.0 | 12.0 |
| 12 | <0 | 22.5 | 27.0 |
| | 0 to 10 | 19.8 | 23.8 |
| | 10 to 20 | 18.0 | 21.6 |
| | 20 to 30 | 13.5 | 16.2 |
| | 30 to 40 | 9.0 | 10.8 |
| 14 | <0 | 20.3 | 24.3 |
| | 0 to 10 | 17.8 | 21.4 |
| | 10 to 20 | 16.2 | 19.4 |
| | 20 to 30 | 12.2 | 14.6 |
| | 30 to 40 | 8.1 | 9.7 |
| 16 | <0 | 18.2 | 21.9 |
| | 0 to 10 | 16.0 | 19.2 |
| | 10 to 20 | 14.6 | 17.5 |
| | 20 to 30 | 10.9 | 13.1 |
| | 30 to 40 | 7.3 | 8.7 |
| 18 | <0 | 16.4 | 19.7 |
| | 0 to 10 | 14.4 | 17.3 |
| | 10 to 20 | 13.1 | 15.7 |
| | 20 to 30 | 9.8 | 11.8 |
| | 30 to 40 | 6.6 | 7.9 |

FIG. 9

| Step | RF_AGC setting (dB) | BB_AGC setting (dB) | Comment |
|---|---|---|---|
| 1 | 10 | 35 | Init |
| 2 | 14 | 31 | Algo loop |

FIG. 10

| RF_Gain | BB_Gain | Ndist | Ntherm | Ntot |
|---|---|---|---|---|
| 10.0 | 35.0 | 7.0 | 10.0 | 17.0 |
| 12.0 | 33.0 | 7.7 | 9.0 | 16.7 |
| 14.0 | 31.0 | 8.5 | 8.1 | 16.6 |
| 16.0 | 29.0 | 9.3 | 10.9 | 20.3 |
| 18.0 | 27.0 | 10.2 | 9.8 | 20.1 |

FIG. 11

AUTOMATIC GAIN CONTROL OF RADIO DEVICES

FIELD OF THE INVENTION

The present invention relates to automatic gain control (AGC) of radio devices. A particular, but not exclusive, application of the present invention is in devices used in mobile applications where low power consumption is an important parameter, for example digital TV tuners used in battery operated devices.

BACKGROUND OF THE INVENTION

FIG. 1 of the accompanying drawings is a block schematic diagram of a simplified radio receiver and illustrates a classical radio frequency (RF) AGC system. An antenna 10 is coupled to a gain controlled RF amplifier 12. An output of the RF amplifier 12 is coupled to a simplified frequency down-conversion stage 14 in which a received RF signal is frequency down-converted to base band and applied to a demodulator 16. The architecture of the frequency down-conversion stage 14 can be of any suitable design known in the art and for the purpose of illustration comprises a super-heterodyne stage comprising a mixer 18 having inputs for the output of the RF amplifier 12 and a local oscillator 20, respectively. A bandpass filter 22 is coupled to an output of the mixer 18 to select the desired signal from the products of mixing. A baseband or audio frequency gain controlled amplifier 24 has an input coupled to an output of the bandpass filter 22 and an output coupled to an input of the demodulator 16.

Broadly stated the purpose of AGC is to adjust automatically the gain of the receiver such as to enable the receiver to deliver an adequate level of signal to the input of the demodulator 16. As an example if it assumed that the demodulator is an analog-to-digital converter (ADC) with a 1 Vpp range, then, the adequate level delivered by the receiver output should be 1 Vpp.

In the circuit illustrated in FIG. 1, AGC is applied to the RF amplifier 12 and to the baseband amplifier 24. The signal received at the antenna 10 is a broadband signal shown by the inset drawing, the broadband signal includes the desired signal $f_W$ and unwanted signals in adjacent bands. The total power received from the antenna at an input of the RF amplifier 12 is Ptot. The power of the amplified broadband signal at the output of the RF amplifier 12 is Pout and this power is detected at the output of the amplifier 12 using a power detector 26. The power detector 26 produces an output Pdet which is applied to one input of a comparator 28. A threshold stage 30 is connected to a second input of the comparator 28 and provides a threshold value against which Pdet is compared. The threshold value is selected to maximise the gain of the RF amplifier 12. An output of the comparator 28 is coupled to an integrator 32 which has an output coupled to a control input 13 of the RF amplifier 12. In operation if Pdet exceeds the threshold value then the AGC circuit reduces the gain of the RF amplifier 12 and conversely if Pdet is less than the threshold value the AGC circuit increases the gain of the RF amplifier 12. This process continues with the objective of adjusting the gain until Pdet equals the threshold. In practice Pout is regulated in order to avoid overloading the stages following the RF amplifier 12, in this illustrated case, the frequency down-conversion stages. The base band amplifier 24 receives a narrowband signal, shown inset, comprising the desired signal $f_W$ and, possibly, residues $f_R$ from the adjacent channels depending on the quality of filtering by the bandpass filter 22 and provides an amplified constant level output signal $f_{WCL}$ to the demodulator 16. In order to control the gain of the base band amplifier an output derived from the demodulator 16 is applied to a control input 25 of the base band amplifier 24 in order to keep its output constant.

US Patent Application Publication US 2003/0143967 A1 discloses applying AGC to an analog cellular telephone receiver having a zero-IF or low-IF architecture. In the interests of brevity, the architecture of the zero-IF converter, filters and ADCs will not be described as these are well known in the art. Compared to the architecture shown in FIG. 1, the gain controlled RF amplifier is a LNA and the baseband amplifier comprises a digital variable gain amplifier (VGA) whose outputs are coupled to a digital FM demodulator. The voltages at the outputs of the digital VGA are also coupled to an accumulator. An output of the accumulator is coupled to a controller for providing gain control signals to be applied to the LNA and the digital VGA in order to maintain the average power gain to be equal to a constant set point supplied to the controller. In the LNA the gain is adjusted in gain steps and this has the effect of introducing unwanted phase shifts into the RF signals from the LNA. In order to eliminate the unwanted phase shifts, a phase shifter controlled by the controller is connected into the quadrature related signal paths to the inputs of the digital VGA. The controller is synchronised to apply a respective phase correction just as the gain adjusted signal reaches the phase shifter, this is done by applying to a phase correction signal a group delay corresponding to the signal propagation delay between the LNA and the phase shifter.

A drawback to the known AGC circuits is that the gain is set as high as possible in the first stages in order to achieve a good noise figure whilst at the same time avoiding introducing excessive non-linearities which could lead to degradation of the wanted signal as well as the unwanted signals. As a consequence these stages are designed to achieve sufficient linearity and this in turn leads to a high power consumption which is undesirable in battery powered devices. The dominant source of signal degradation is then thermal noise.

SUMMARY OF THE INVENTION

An object of the present invention is to reduce the power consumption in radio devices having AGC.

According to a first aspect of the present invention there is a method of operating a RF device having a first RF gain stage and a second narrowband gain controlled amplifying stage for amplifying a signal in a wanted bandwidth, wherein a gain setting of the first RF gain stage is selected to maximise the signal-to-noise ratio (SNR) by optimising the total noise in the wanted bandwidth and a gain setting of the second narrowband gain controlled amplifying stage is adjusted to provide a substantially constant level output.

According to a second aspect of the present invention there is provided a radio device comprising a RF input, a first RF gain stage and a second narrowband gain controlled amplifying stage, wherein a first control device is provided for selecting a gain setting of the first RF gain stage to maximise the signal-to-noise ratio (SNR) by minimising the total noise in the wanted bandwidth and an automatic gain control circuit is provided for adjusting a gain setting of the second narrowband gain controlled amplifying stage to provide a substantially constant level output.

The present invention is based on the realisation that in low power consumption devices the thermal noise and distortion noise should both be taken into account when adjusting the RF gain and that in order to provide to the demodulator a signal having the maximum signal-to-noise (SNR) the best trade-off between a noise figure and non-linearity should be obtained. As a consequence the RF gain is not maximised thereby reducing the power consumption.

BRIEF DESCRIPTION OF THE DRAWINGS

The present invention will now be described, by way of example, with reference to the accompanying drawings, wherein:

FIG. 8 is a first table giving distortion noise values (Ndist) versus received RF Power (Ptot), RF_Gain and RF Frequency of the signal to be received, FIG. 9 is a second table giving thermal noise values (Ntherm) versus RF_Gain, BB_Gain and RF Frequency of the signal to be received, FIG. 10 is a table illustrating the best trade-off between distortion noise and thermal noise, and FIG. 11 is a tabular summary of an example of computed total noise Ntot (Ntot=Ndist+Ntherm) versus RF_Gain and BB_Gain values for a given total input power Ptot obtained using the first and second tables shown in FIGS. 8 and 9.

In the drawings the same reference numerals have been used to indicate corresponding features.

DETAILED DESCRIPTION OF THE EMBODIMENTS

Figure 1:
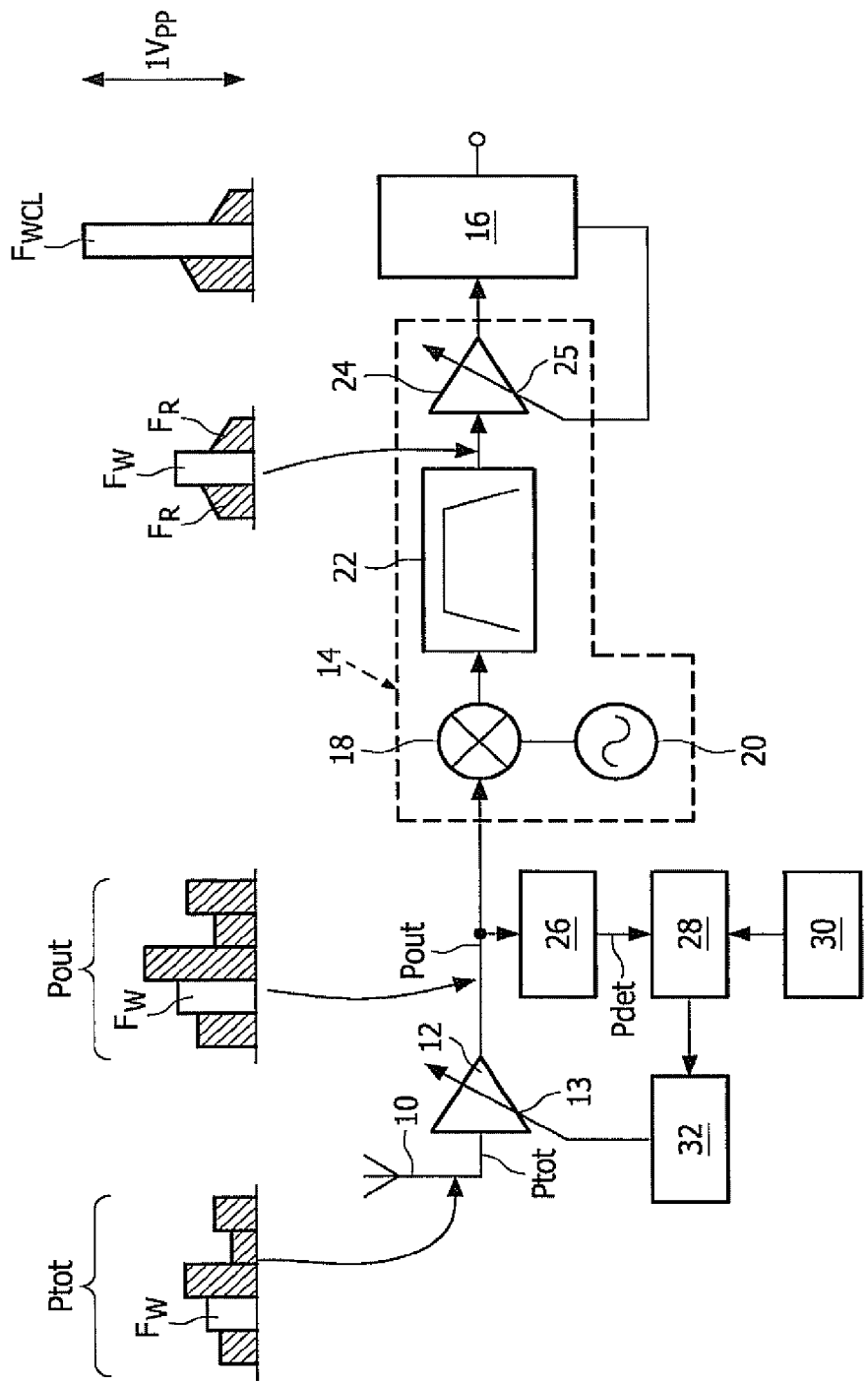
FIG. 1 is a block schematic diagram of a radio device having classical RF AGC.

As FIG. 1 has already been described in the preamble of this specification it will not be described again.

Figure 2:
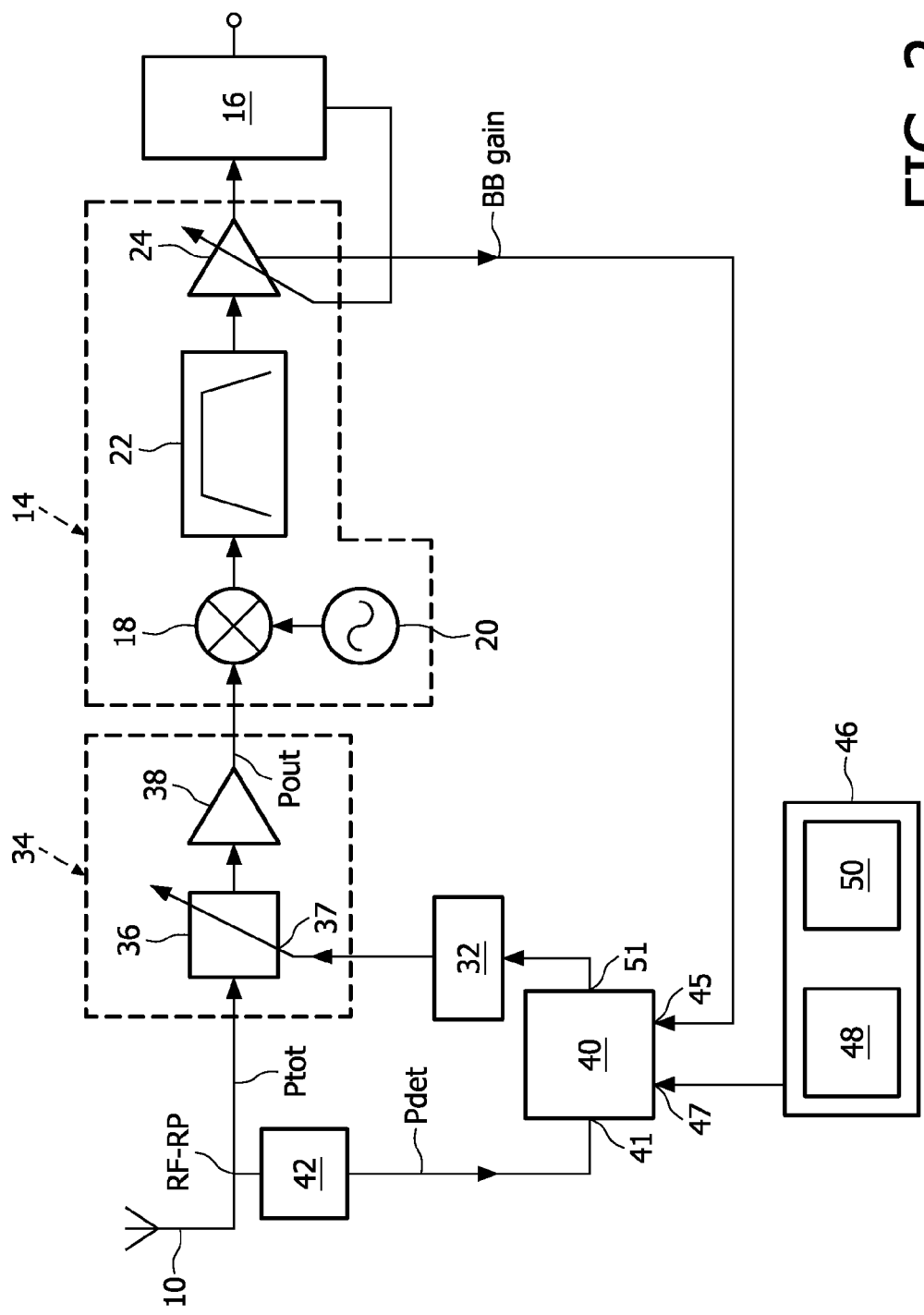
FIG. 2 is a block schematic diagram of a device made in accordance with the present invention.

Referring to FIG. 2, the antenna 10 is coupled to a broadband RF gain stage 34 formed by a programmable attenuator 36 having a control input 37 and an RF amplifier 38 designed for a low power consumption, and a low noise figure, that is, good sensitivity. An output of the RF amplifier 38 is coupled to a simplified frequency down-conversion stage 14 having the same architecture as shown in FIG. 1. In the interests of brevity the description of the stage 14 will not be repeated. An output of the gain controlled amplifier 24 is coupled to the demodulator 16.

AGC is applied to the RF gain stage 34 by means of a processor 40 producing a control signal which, after integration, is applied to the programmable attenuator 36. The processor 40 has an input 41 for receiving an indication Pdet of the total power Ptot of the signal received at the antenna 10. In the illustrated embodiment the indication Pdet is obtained using a power detector 42 having an input coupled to junction, referenced RF-RP, in the signal path between the antenna 10 and the RF_Gain stage 34 and an output coupled to the input 41 of the processor 40. (The detection point can also be positioned elsewhere, for instance, at the output of the RF_Gain stage 34.) An indication BB_Gain of the gain setting applied to a control input 25 of the base band amplifier 24 is supplied to an input 45 of the processor 40 by means of a line 44. (Other information can also be delivered to the processor 40 for better accuracy, like received frequency or temperature of the receiver.) A memory device 46 is coupled to an input 47 of the processor 40. The memory device 46 comprises at least two areas 48, 50 functioning as look-up tables (LUTs) storing, respectively, a predetermined example of a model of the RF distortion noise Ndist versus RF_Gain and Ptot characteristics in different frequency ranges and the thermal noise Ntherm versus BB gain and RF gain characteristics in the same different frequency ranges. This model is determined for a particular design of receiver and is different from a model determined for another design of receiver. An illustrative example of a model is shown in tabular form in FIGS. 8 and 9 of the accompanying drawings.

An output 51 of the processor 40 is coupled to an integrator 32 which applies a RF_Gain control signal to the input of the programmable attenuator 36. The programmable attenuator can be adjusted continuously or in steps.

The feature of the programmable attenuator 36 preceding the RF amplifier 38 enables the receiver linearity to be improved by increasing the attenuation prior to the input of the RF amplifier 38 without additional power consumption, but this is at the expense of the thermal noise degrading as the attenuation in front increases.

The attenuator 36 is programmed to control the RF gain whereas the processor 40 serves to compute and set the RF gain for optimising the SNR of the wanted signal bandwidth.

Figure 3:
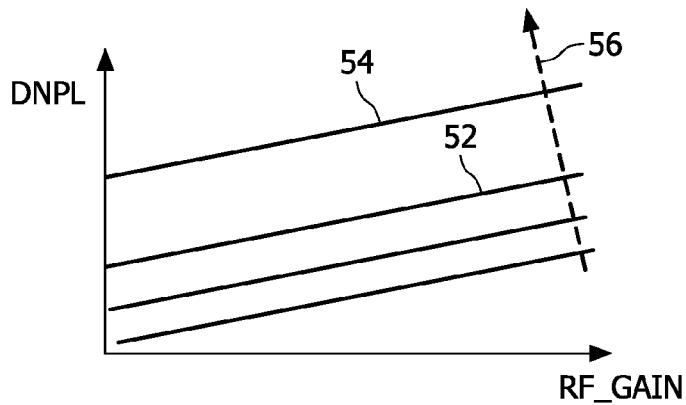
FIG. 3 is a graph of distortion noise as a function RF gain and total power Ptot.

FIG. 3 is a graph of distortion noise power level DNPL (referred to the receiver input RF-RP) as a function of RF gain (abscissa) and Total power Ptot. Reference numeral 52 indicates a curve for Ptot0 and reference numeral 54 indicates a curve for a given Ptot. The broken line arrow 56 indicates that the distortion noise increases when Ptot increases.

Figure 4:
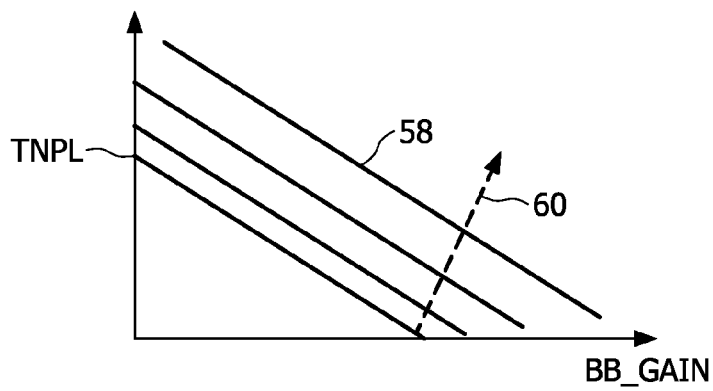
FIG. 4 is a graph of thermal noise as a function of RF and BB gains.

FIG. 4 is a graph of thermal noise power level TNPL (referred to the receiver input) as a function of RF gain and BB gain (abscissa). Reference numeral 58 indicates a curve for a given RF gain and the broken line arrow 60 indicates that the thermal noise increases when the RF gain decreases.

If the RF gain increases, the BB gain should decrease (and vice versa) in order to maintain a constant level at the receiver output, that is, at the input to the demodulator 16.

From FIGS. 3 and 4 it can be concluded that the RF amplifier 38 can have a low linearity. The higher is the attenuation, the more linear is the receiver—see FIG. 3. The lower the attenuation is, the better is the receiver sensitivity or noise figure—FIG. 4.

Figure 5:
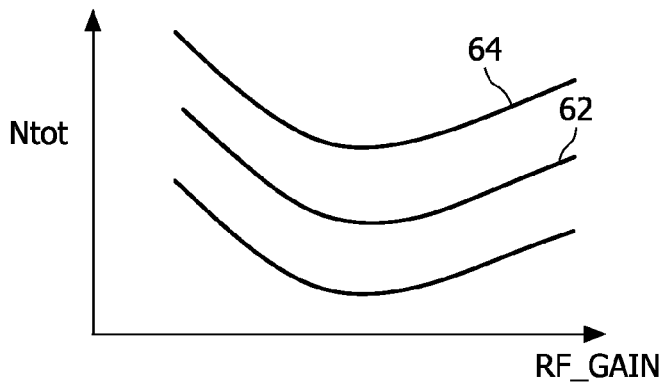
FIG. 5 is a graph of the total noise into the wanted signal bandwidth as a function of the setting of the RF and BB gains and the total power Ptot.

FIG. 5 is a graph of the total noise power level, Ntot, into the wanted signal bandwidth and referred to the receiver input RF-RP, as a function of the setting of the RF_Gain, BB_Gain and total input power Ptot. Reference numerals 62 and 64 indicate, respectively, the curve for Ptot0 and the curve for another value of Ptot. In other words the processor is able to minimise the total noise power level Ntot into the wanted signal bandwidth by optimising the thermal noise/distortion noise trade-off and in order to do this it is necessary to process the total input power Ptot, BB_Gain setting and the RF_Gain setting. From this data, an estimation of Ntot (into the wanted signal bandwidth) can be computed and the AGC strategy enables the best RF_Gain to be determined in order to minimise Ntot and in so doing optimise the SNR.

Figure 6:
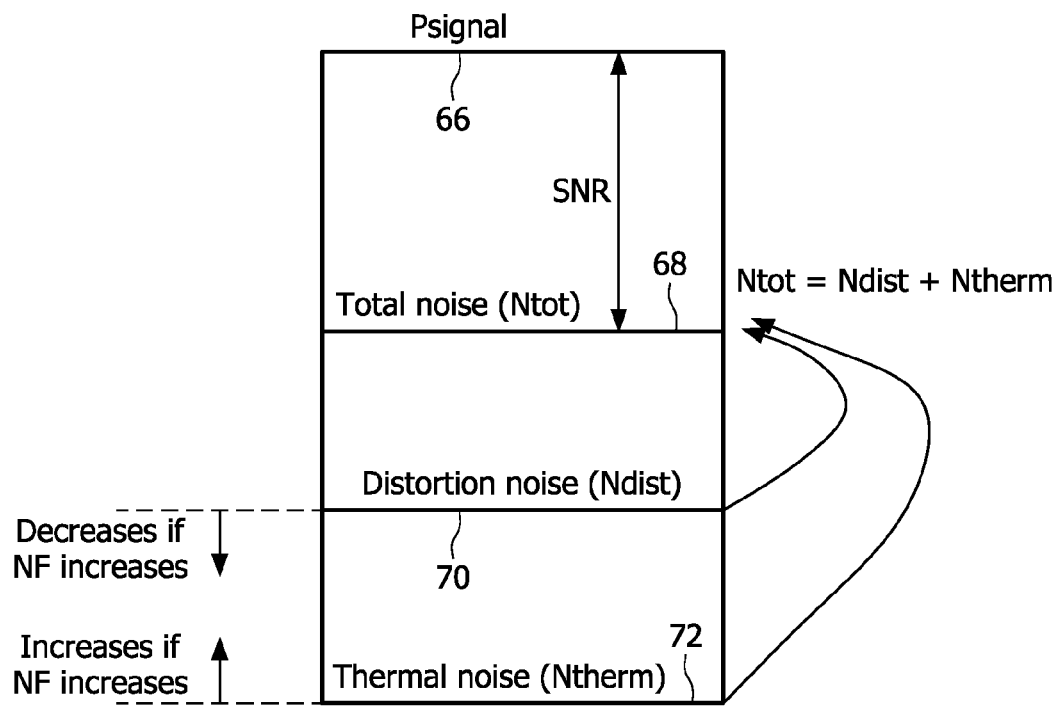
FIG. 6 is a diagram illustrating the noise and signal values contributing to the calculation of the SNR.

FIG. 6 illustrates a wanted Psignal 66 and the total noise component 68, the signal and noise having the same bandwidth. The total noise component 68 is composed of the sum of the distortion noise 70 and the thermal noise 72. The ratio of the total noise component 68 to the Psignal 66 is the SNR. The distortion noise 70 and the thermal noise 72 are related in that the distortion noise 70 will decrease if the thermal noise level referred to the junction RF-RP (FIG. 2) NF increases and the thermal noise increases if NF increases. The method in accordance with the present invention relates to a strategy for finding the best trade-off between distortion noise and thermal noise in order to make the SNR as large as possible whilst avoiding the classical technique of operating the RF amplifier at maximum power.

Figure 7:
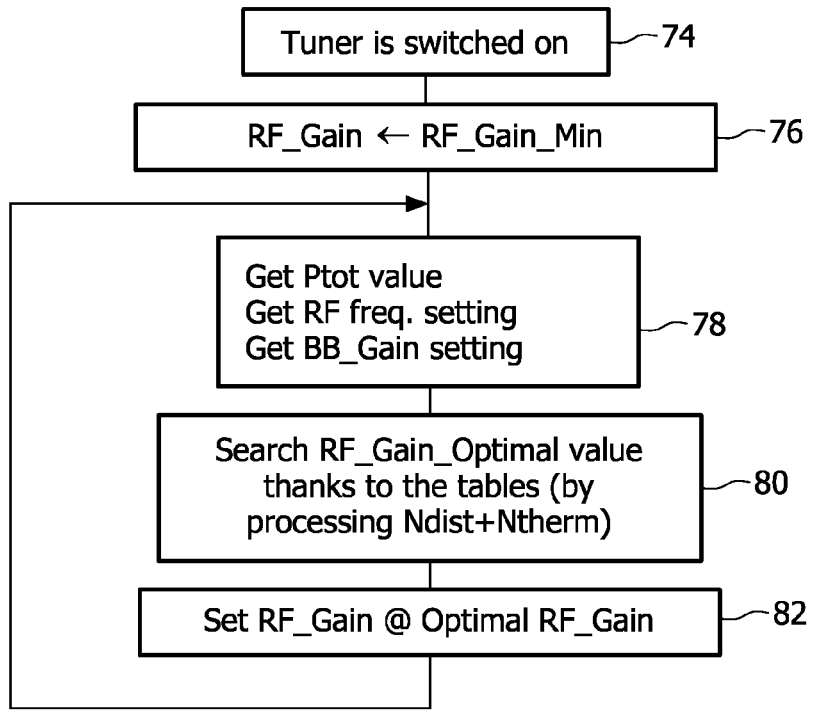
FIG. 7 is a flow chart illustrating an embodiment of a method in accordance with the present invention.

FIG. 7 is a flow chart relating to an embodiment of the method in accordance with the present invention. Block 74 relates to switching the radio device on. Block 76 relates to initialising the radio device by setting the RF_Gain to a RF_Gain_Min value to protect the tuner of the radio device in the event of a strong RF level is present at the antenna 10 (FIG. 2). Block 78 relates to the processor obtaining the total power Ptot, the RF frequency setting and the BB_Gain setting. These data are necessary to get the values of Ndist, the distortion noise figure and Ntherm, the thermal noise figure, from the LUTs 48, 50 (FIG. 2). Block 80 relates to the processor computing the sum of Ndist+Ntherm for all possible values of RF_Gains and determining the minimum value of the sum and thereby the optimal value for the RF_Gain. Block 82 relates to setting the RF_Gain to the optimal value. In so doing the processor adjusts the setting of the programmable attenuator 36 to obtain the maximum SNR by the best trade-off between distortion noise and thermal noise. The BB_Gain figure is adjusted using the AGC loop between the demodulator 16 and the gain controlled amplifier 24 so that the narrowband signal delivered to the demodulator 16 has an adequate level. Each time a new RF_Gain is set, a new BB_Gain is set automatically to maintain a constant level at the demodulator input.

FIGS. 8 to 11 relate to an example of the method in accordance with the present invention.

In the first and second tables, FIGS. 8 and 9, respectively, the RF_Gain is assumed to be adjustable in 2 dB steps from 10 dB to 18 dB, and the BB_Gain to be adjustable in 5 ranges from 0 to 40 dB, the 5 ranges being <0, 0 to 10, 10 to 20, 20 to 30 and 30 to 40 dB. Two bands of frequencies lying in the UHF European terrestrial TV band 470 to 862 MHz were chosen to show that distortions and thermal noise into a tuner can vary with RF frequency. Optionally temperature could have been taken into account when compiling such a table. In a real implementation, more values would have been given in the tables to give a greater accuracy. Moreover such numbers may come from system measurements of an integrated receiver device and/or from interpolation/extrapolation/modelling.

The first table, FIG. 8, illustrates that when the RF_Gain is small, this means that the RF attenuation is high and then, the distortions are low.

The second table, FIG. 9, illustrates that when RF_Gain is small, this means that RF attenuation is high and then, the thermal noise is high.

In order to illustrate the method in accordance with the present invention, it will be assumed that a signal is received at 500 MHz, which lies in the left hand column in the first and second tables shown in FIGS. 8 and 9; that Ptot (total input power=signal plus interferers)=−20 dBm; and that the initial condition: wanted signal power level (+ possible adjacent signals that are still visible at the input to the demodulator 16 (FIG. 2)) is such that RF_Gain=RF_Gain_Min→BB_Gain=35 dB.

Referring to FIG. 10, in step 1 the receiving device is initialised by setting the RF_Gain to 10 dB (then BB_Gain=35 dB. With these settings the first table gives a Ndist of 7.0 for a Ptot of −20 dBm, that is, lying in the range of −25 to −15 dBm and the second table gives a Ntherm of 10.00 for a BB_Gain of 35 dB, that is value lying in the range 30 to 40 dB. The total noise (Ndist+Ntherm) equals 17. Step 2 illustrates the processor 40 (FIG. 2) of the receiving device having applied the algorithm and, after having processed the different possible values for Ntot, determining the best trade-off between distortion noise Ndist and thermal noise Ndist to give a minimum value for Ntot and thereby the maximum SNR (without having to operate the RF gain stage 34 at maximum power).

The following simplified explanation is given for how the respective rows in the table shown in FIG. 11 are obtained.

The first row is obtained as described above by for a RF_Gain=10 dB and a Ptot=−20 dBm, Ndist=7.0 and for RF_Gain=10 dB, BB_Gain=35 dB and lies in the range 30 to 40 dB, and Ntherm=10.0, thus Ntot=7.0+10.0=17.0.

The second row is obtained by making the RF_Gain=12 dB, for a Ptot=−20 dBm, Ndist=7.7 and for RF_Gain=12 dB, the BB_Gain has decreased to 33.0 dB but still lies in the range 30 to 40 dB, and Ntherm=9.0, thus Ntot=16.7.

The third row is obtained by making RF_Gain=14 dB, for Ptot=−20 dBm, Ndist=8.5 and for RF_Gain=14 dB, the BB_Gain of 31 dB still lies in the range 30 to 40 dB, and Ntherm=8.1, thus Ntot=16.6.

The fourth row is obtained by making RF_Gain=16 dB, for Ptot=−20 dBm, Ndist=9.3. However for RF_Gain=16 dB, the BB_Gain has decreased again to 29 dB and now lies in the range 20 to 30 dB, and Ntherm=10.9, thus Ntot=20.3.

The fifth row is obtained by making RF_Gain=18 dB, for Ptot=−20 dBm, Ndist=10.2 and for RF_Gain=18 dB, the BB_Gain has decreased again to 27 dB and still lies in the range 20 to 30, and Ntherm=9.8, thus Ntot=20.1.

By comparing the respective Ntot figures it is evident that by setting RF_Gain to 14 dB and BB_Gain to 31 dB, Ntot has a minimum value and therefore on the basis of FIG. 6 the SNR is a maximum.

In the present specification and claims the word "a" or "an" preceding an element does not exclude the presence of a plurality of such elements. Further, the word "comprising" does not exclude the presence of other elements or steps than those listed.

The use of any reference signs placed between parentheses in the claims shall not be construed as limiting the scope of the claims.

From reading the present disclosure, other modifications will be apparent to persons skilled in the art. Such modifications may involve other features which are already known in the design, manufacture and use of AGC systems and component parts therefor and which may be used instead of or in addition to features already described herein.

The invention claimed is:

1. A method of operating a radio frequency (RF) device having a RF gain stage coupled to a narrowband gain controlled amplifying stage for amplifying a signal in a wanted bandwidth, the method comprising:
    selecting a gain setting of the RF gain stage to maximize a signal-to-noise ratio (SNR) by optimizing total noise in the wanted bandwidths;
    adjusting a gain setting of the narrowband gain controlled amplifying stage to provide a substantially constant level output;
    adjusting the gain setting of the RF gain stage based upon the gain setting of the narrowband gain controlled amplifying stage, total power received at an antenna, and a noise model.

2. The method as claimed in claim 1, wherein the RF gain stage comprises a programmable attenuator coupled to an input of a RF amplifier.

3. The method as claimed in claim 2, wherein the gain setting of the narrowband gain controlled amplifying stage is taken into account while adjusting the value of the programmable attenuator.

4. The method as claimed in claim 2, wherein the noise model uses both distortion noise and thermal noise to adjust the programmable attenuator.

5. The method as claimed in claim 2, wherein the RF device further comprises an input for a RF signal coupled to the RF gain stage, means for frequency down-converting a gain adjusted RF signal to a wanted signal bandwidth, and means for applying the down-converted signal to the narrowband gain controlled amplifying stage, the method further comprising:
- determining the total power (Ptot) of the input RF signal;
- determining a RF gain setting (RF_Gain) applied to the programmable attenuator;
- determining a baseband gain setting (BB gain) applied to the narrowband gain controlled amplifying stage;
- determining a distortion noise value as a function of both RF Gain and Ptot;
- determining a thermal noise value as a function of both RF Gain and BB gain; and
- adjusting RF Gain to minimize total noise power level in the wanted signal bandwidth.

6. The method as claimed in claim 5, further comprising:
- storing distortion noise values in a first look-up table; and
- storing thermal noise values in a second look-up table.

7. A radio frequency (RF) device comprising;
- a radio frequency (RF) input;
- a RF gain stage: and
- a narrowband gain controlled amplifying stage, wherein a control device selects a gain setting of the RF gain stage to maximize a signal-to-noise ratio (SNR) by minimizing the total noise in a wanted bandwidth and an automatic gain control circuit adjusts a gain setting of the narrowband gain controlled amplifying stage to provide a substantially constant level output, wherein the gain setting of the RF gain stage is adjusted based upon the gain setting of the narrowband gain controlled amplifying stage, total power received at an antenna, and a noise model.

8. The RF device as claimed in claim 7, wherein the RF gain stage further comprises:
- a programmable attenuator coupled to an input of a RF amplifier.

9. The RF device as claimed in claim 8, wherein the control device further comprises:
- a computation stage having an input for the gain setting of the narrowband gain controlled amplifying stage, wherein the computation stage uses the gain setting of the narrowband gain controlled amplifying stage when determining an adjustment to be made to the programmable attenuator.

10. The RF device as claimed in claim 9, wherein the computation stage has an input for receiving both distortion noise values and thermal noise values and uses both the distortion noise values and the thermal noise values when determining the adjustment to be made to the programmable attenuator.

11. The RF device as claimed in claim 10, further comprising:
- a look-up table for storing both the distortion noise values and the thermal noise values.

12. The RF device as claimed in claim 9, wherein the control device comprises:
- means for determining total power (Ptot) of the input RF signal;
- means for determining a RF gain setting (RF_Gain) applied to the programmable attenuator;
- means for determining a baseband gain setting (BB_Gain) applied to the narrowband gain controlled amplifying stage;
- means for obtaining a distortion noise value as a function of both RF Gain and Ptot;
- means for obtaining a thermal noise value as a function of both RF Gain and BB Gain; and
- means for adjusting RF Gain by minimizing total noise in the wanted bandwidth.

13. The RF device of claim 11, wherein the look-up table stores a distortion noise model based upon both RF_Gain and Ptot.

14. The RF device of claim 11, wherein the look-up table stores a thermal noise model based upon both BB_Gain and RF_Gain.

* * * * *